United States Patent [19]

Fukuda et al.

[11] Patent Number: 4,637,854
[45] Date of Patent: Jan. 20, 1987

[54] METHOD FOR PRODUCING GAAS SINGLE CRYSTAL

[75] Inventors: Tsuguo Fukuda, Yokohama; Kazutaka Terashima, Ebina, both of Japan

[73] Assignees: Agency of Industrial Science and Technology; Ministry of International Trade and Industry, both of Tokyo, Japan

[21] Appl. No.: 571,091

[22] Filed: Jan. 16, 1984

[30] Foreign Application Priority Data

Jan. 18, 1983 [JP] Japan .................................. 58-5181
May 7, 1983 [JP] Japan .................................. 58-78899
May 7, 1983 [JP] Japan .................................. 58-78900

[51] Int. Cl.[4] ...................... C30B 15/22; C30B 27/02
[52] U.S. Cl. .............................. 156/607; 156/617 SP
[58] Field of Search ................ 156/605, 607, 617 SP, 156/616 A, DIG. 70, DIG. 81; 422/249

[56] References Cited

U.S. PATENT DOCUMENTS 3,607,139  9/1971  Hanks .................................. 156/619

FOREIGN PATENT DOCUMENTS 1311048  3/1970  United Kingdom .
2108404  9/1981  United Kingdom .

OTHER PUBLICATIONS

Utech et al., "Elimination of Solute Bonding in Indium Antimonide Crystals by Growth in a Magnetic Field", *J. of Applied Physics*, v 37, No. 9 (1966).
Terashima et al., "Electrical Res. of Undoped GaAs Single Crystals Grown by Magnetic Field Applied LEC Technique", Jap. *J. of Applied Physics*, 22(6) (1983).

Primary Examiner—Barry S. Richman
Assistant Examiner—Michael S. Gzybowski
Attorney, Agent, or Firm—Oblon, Fisher, Spivak, McClelland, & Maier

[57] ABSTRACT

A method for the production of a gallium arsenide single crystal which comprises bringing a seed crystal into contact with a fused layer of raw materials for the crystal while applying to the fused layer a magnetic field which has intensity enabling the temperature fluctuation in the neighborhood of the solid-liquid boundary in the fused layer to be repressed to within 1° C., thereby effecting crystal growth.

7 Claims, 7 Drawing Figures

METHOD FOR PRODUCING GAAS SINGLE CRYSTAL

BACKGROUND OF THE INVENTION

This invention relates to a method for the production of a gallium arsenide (GaAs) single crystal.

Of the III-V group compound semiconductors, GaAs exhibits outstanding electron mobility and is finding extensive utility as the crystalline substrate for elements in ultra-high speed integrated circuits and optoelectronic integrated circuits. GaAs is attracting keen attention because (1) when it is of high quality it acquires a high insulating property exceeding $10^7$ $\Omega$.cm in resistivity, (2) it can be produced in a grade having minimal intracrystalline defects and enjoying even distribution of such defects, and (3) it can be easily produced in large wafers, for example. As a method capable of producing a GaAs single crystal fulfilling all these requirements, the liquid-encapsulated Czochralski method (LEC method) is receiving increasing attention. This LEC method Czochralski method has a low-pressure version and a high-pressure version. Since the low-pressure LEC method uses as its starting material the GaAs polycrystal formed by the boat growth method, the single crystal suffers inclusion of impurities, predominantly silicon (Si) and requires incorporation of chromium (Cr), a substance capable of imparting a semi-insulating property to the crystal. The addition of Cr in any concentration exceeding 5 ppm by weight entails undesirable segregation of Cr in the crystal. When Cr is added in a concentration of 3 to 5 ppm by weight, the grown crystal suffers a serious defect in thermal conversion. Even when the concentration of Cr added is lowered to the range of 1 to 2 ppm by weight, the grown crystal still suffers a defect in thermal conversion. Another problem is that uniform distribution of the added Cr throughout the grown crystal is no easy task.

By contrast, the high-pressure LEC method which affects synthesis directly on the starting material does not require addition of Cr. Since this method heats and synthesizes Ga and As, the raw materials for crystal, and boron oxide ($B_2O_3$), an encapsulant, under high pressure, the melt of raw materials for crystal in the crucible assumes a highly unstable state in the presence of thermal convection. Since this method effects the operation of crystal growth under such an unstable state, the shape of the solid-liquid boundary varies greatly. Owing to the thermal conversion of the melt of raw materials, the grown crystal suffers occurrence of striation and native defect $EL_2$ level inherent in GaAs. The electric property, therefore, varies greatly within or between grown crystals, and the thermal stability, which has a bearing upon the native defect, is degraded. An integrated circuit of uniform electric property and device property cannot be easily produced with high repeatability using a crystal thus grown as its substrate.

In the production of a Si single crystal, it is a widely used practice to improve the quality of the grown crystal by applying a magnetic field to the crystal under growth. However, it has been considered that application of a magnetic field to the melt of raw materials for growing GaAs single crystals under high pressure would cause the melt to be shaken. Further, since a GaAs single crystal manufacturing apparatus has a more complicated construction than that of a Si single crystal manufacturing apparatus and it is difficult to apply a magnetic field to a crucible containing therein a melt of raw materials, application of a magnetic field has not been carried out as likely as not.

SUMMARY OF THE INVENTION

An object of this invention is to provide a method for producing, with high repeatability, a GaAs single crystal of high quality having high purity, suffering only minimal defect, enjoying high thermal stability, and exhibiting electric resistance of at least $1 \times 10^8$ $\Omega$.cm by controlling the crystal quality during its growth.

The method of this invention which effects the production of a GaAs single crystal of high quality by following the procedure of the high-pressure LEC method is characterized by synthesizing a melt of raw materials for the crystal within a crucible kept under high pressure and, subsequently to the synthesis, applying to the melt a magnetic field adjusted to repress the temperature fluctuation near the boundary between the melt and the encapsulant to within 1° C. and, at the same time, introducing a seed crystal into contact with the aforementioned melt of raw materials for the crystal, and thereafter pulling the seed crystal thereby effecting crystal growth. When the magnetic field is applied as described above to the melt of raw materials for the crystal, the thermal convection in the melt is curbed and the temperature fluctuation is lowered to less than 1/100 the conventional level and the solid-liquid boundary in the melt is allowed to remain in a stable state during the course of crystal growth. Consequently, there is produced a GaAs single crystal of high quality without entailing the otherwise inevitable occurrence of striation and native defect $EL_2$ level. Further since the crystal growth is effected while the solid-liquid boundary in the melt is kept in a stable state, the grown GaAs single crystal consequently obtained acquires high quality without entailing drawbacks such as void and inclusion of impurities even when the pulling of crystal is carried out at a speed of 15 mm/hour or more. When the melt of raw materials for the crystal contains Cr in a low concentration, the grown crystal has Cr uniformly distributed therein and acquires electric resistance exceeding $10^8$ $\Omega$.cm despite the low concentration of Cr. Thus, there is produced a GaAs single crystal of high quality because of reduction in the high impurities level inherent in GaAs.

The other objects and the other characteristics of the present invention will become apparent to those skilled in the art as the further disclosure of the invention is made in the following detailed description with reference to the accompanying drawings.

DESCRIPTION OF PREFERRED EMBODIMENTS

Figure 1:
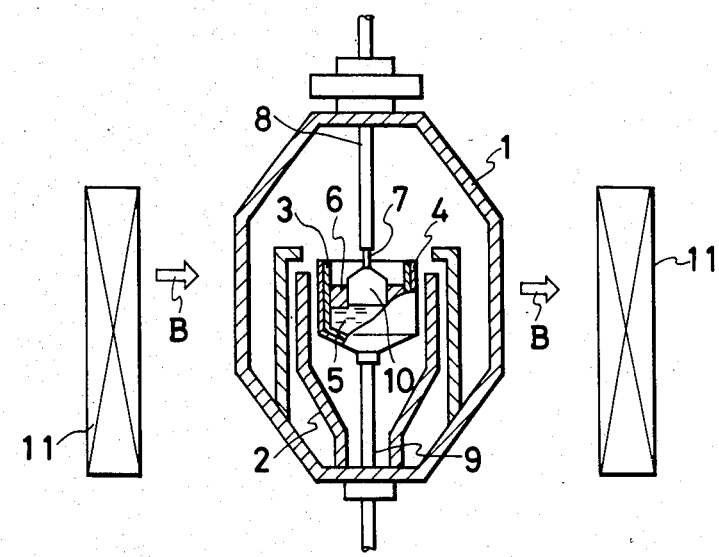
FIG. 1 is a schematic cross section illustrating a typical apparatus for producing a single crystal in accordance with the method of this invention.

FIG. 1 is a schematic diagram illustrating a typical apparatus for working the high-pressure LEC method known as a method for directly effecting synthesis of a GaAs single crystal. In the diagram, 1 denotes a high-pressure chamber. Inside this high-pressure chamber, a crucible 3 of quartz or boron nitride sheathed with a supporting member 4 such as of carbon material is set in position. This crucible 3 is supported by a rotary support shaft 9 so as to be rotated and moved vertically. The crucible 3 is encircled with a heater 2 adapted to heat the crucible to a prescribed temperature and keep it at that elevated temperature. Above the crucible 3 is disposed a pulling shaft 8 having a seed crystal 7 fixed to the lower end thereof. This pulling shaft is adapted to be rotated about its axis and moved vertically along the axis. A magnetic field applying device 11 is disposed outside the high-pressure chamber 1 to apply a magnetic field B to the neighborhood of the boundary between a melt of raw materials for the crystal and an encapsulant inside the crucible 3.

In the apparatus constructed as described above, the crucible 3 is charged with prescribed amounts of Ga and As in conjunction with $B_2O_3$ as an encapsulant and set in position within the high-pressure chamber 1. The high-pressure chamber, with the interior thereof pressurized with an inert gas such as argon or nitrogen, is heated by the heater 2 to a temperature exceeding the melting temperatures of the raw materials for the crystal to melt the raw materials and the encapsulant inside the crucible.

In consequence of the thermal treatment described above, there are produced an upper molten layer 6 of $B_2O_3$ as the encapsulant and a lower molten layer 5 of GaAs. In the raw material section inside the crucible, the molten layer 6 of $B_2O_3$ as the encapsulant is formed. When the raw materials inside the crucible are thoroughly molten, the pulling shaft 8 is lowered until the seed crystal 7 comes into contact with the molten layer 5 held inside the crucible 3. Subsequently, the pulling shaft 8 is operated so as to rotate the seed crystal 7 at a prescribed rate and, at the same time, pull it from the crucible to effect growth of a GaAs crystal 10. Since the interior of the chamber is kept under pressure of 20 to 30 atmospheres at a temperature of about 1260° C., the molten GaAs layer inside the crucible is apt to undergo heavy thermal convection which tends to induce partial melting of the crystal in growth and induce rapid growth of melt-remelt. If the crystal pulling should be carried out while the molten GaAs layer is in such an unstable state, then the grown crystal would entail drawbacks such as striation, segregation, and void because of thermal conversion. The produced crystal, therefore, would be of low quality.

To preclude this trouble, the present invention applies a magnetic field generated by the magnetic field applying device 11 to the molten GaAs layer at the time that the seed crystal 7 is brought into contact with the molten GaAs layer inside the crucible 3. The intensity of the magnetic field thus applied is such that the temperature fluctuation in the neighborhood of the solid-liquid boundary in the molten layer of raw materials for the crystal is repressed to within 1° C. Specifically, the intensity of the applied magnetic field is required to exceed about 1000 oersteds, although it varies with the construction and the scale of the crystal pulling device. As the intensity of the applied magnetic field is increased, its effect becomes increasingly conspicuous because the thermal convection in the molten GaAs layer is curbed and the temperature fluctuation is repressed. Increasing the intensity of the applied magnetic field too much is liable to cause breakage of the components of the heater 2. The intensity of the applied magnetic field, therefore, should be determined in due consideration of the condition of crystal pulling and the purpose of the produced crystal.

Figure 2:
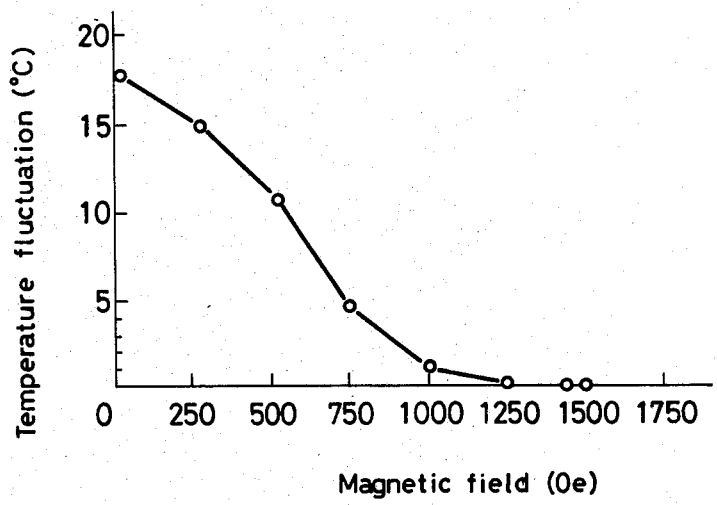
FIG. 2 is a graph showing the relation between the intensity of magnetic field applied to the melt of raw materials for the crystal and the temperature fluctuation of the melt.

FIG. 2 is a graph showing the relation between the intensity of the magnetic field applied under pressure of 20 atmospheres in a crucible having a diameter of about 10 cm and an inner capacity for holding about 1 kg of raw materials and the temperature fluctuation near the solid-liquid boundary in the molten layer of raw materials for the crystal. It is noted from the graph that the temperature fluctuation is about 10° C. when the intensity of the applied magnetic field is 500 oersteds, that it falls below 1° C. when the intensity of the magnetic field exceeds 1000 oersteds, and that it falls below 0.1° C. when the intensity exceeds 1250 oersteds. Thus, the temperature fluctuation is less than 1/100 the temperature fluctuation which occurs in the absence of the application of a magnetic field.

When the magnetic field is applied to the molten GaAs layer as described above, thermal convection in the molten GaAs layer is repressed. When the seed crystal is brought into contact with the molten GaAs layer and then pulled to effect crystal growth, since the solid-liquid boundary is allowed to remain in a tranquil state, the occurrence of striation is precluded and the native defect concentration peculiar to the GaAs crystal is repressed. Consequently, the crystal thus grown acquires high quality.

Figure 3:
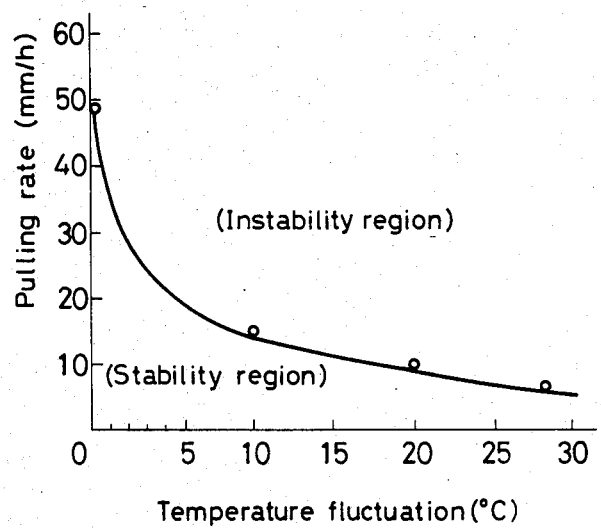
FIG. 3 is a graph showing the relation between the temperature fluctuation of the melt and the pulling rate of crystal.

FIG. 3 is a graph showing the relation between the temperature fluctuation near the solid-liquid boundary in the molten layer of raw materials for the crystal and the pulling rate of crystal. The region indicated in the graph shows the range of conditions under which the single crystal produced acquires quality favorably comparable with the quality of the single crystal produced by the conventional LEC method. From this graph, it is noted that the thermal convection that would otherwise occur in the molten GaAs layer is repressed and the solid-liquid boundary with which the seed crystal is held in contact is allowed to remain in a tranquil state when the temperature fluctuation is kept to within 1° C. Thus, a GaAs single crystal of semi-insulating property can be formed without entailing the occurrence of striation even when the crystal is pulled at a rate exceeding 30 mm/hour. When the intensity of the magnetic field applied is increased to 1500 oersteds, the crystal pulling can be safely continued at a greater rate of 40 mm/hour. Thus, the time required for the production of this crystal is notably decreased and the economy of the production itself is proportionately improved.

It is generally held that when the molten layer of raw materials for the GaAs crystal contains Si, incorporation of Cr in an amount greater than the amount of Si is effective for imparting a semi-insulating property to the produced crystal. The occurrence of crystal defect due to the addition of Cr can be repressed by selecting the amount of the added Cr so that the Cr content in the produced crystal does not exceed $3 \times 10^{15}$ atom/cm$^3$ (0.05 ppm by weight).

The amount of Cr thus added can be decreased by using GaAs raw materials of high purity exceeding 6N or by adopting a crucible of pyrolytic boron nitride. Further, the impurities concentration in the molten layer of raw materials for the crystal can be lowered by subjecting the molten GaAs layer to a treatment of purification by vacuum distillation. Consequently, the amount of Cr to be added can be lowered below the aforementioned critical value.

Despite the knowledge that the amount of Cr to be added has a critical level as described above, it has been customary to effect the crystal growth by using a molten GaAs layer incorporating Cr in an amount far greater than the amount of impurities present in the molten GaAs layer solely because the crystal does not smoothly include Cr therein. In accordance with the present invention, since the thermal convection at the solid-liquid boundary is repressed by the application of a magnetic field, Cr is homogeneously included throughout the crystal and the resistivity of the crystal is increased above $10^8$ Ω.cm even when the crystal growth is carried out by using a molten GaAs layer containing Cr in an amount equal to or slightly greater than the amount of impurities present in the molten GaAs layer. The concentration of Cr thus contained in the crystal is substantially uniform throughout from the head to the tail of the crystal and the electric resistance is uniform above the level of $10^8$ Ω.cm throughout the entire crystal even when the ratio of solidification of the crystal relative to the molten GaAs layer is fixed above 0.7.

The method of this invention, as evident from the description given above, can produce with high repeatability a GaAs single crystal of high quality simply by applying a magnetic field, during the course of crystal growth, to the molten GaAs layer so that the temperature fluctuation may be repressed to within 1° C. Consequently, the pulling rate of crystal can be increased. In accordance with this invention, a GaAs single crystal of high quality and high electric resistance can be obtained economically from a molten GaAs layer containing Cr in a lower concentration.

Now, this invention will be described more specifically below with reference to examples.

EXAMPLE 1

In an apparatus constructed as illustrated in FIG. 1 for the production of a single crystal, a crucible made of pyrolytic boron nitride 100 mm in inside diameter and 100 mm in depth was charged with 500 g of gallium, 600 g of arsenic, and 180 g of boron oxide and set in position inside a high-pressure chamber. After the interior of the high-pressure chamber was pressurized with argon gas to about 50 atmospheres, the crucible was heated to 1300° C. and kept at this temperature. After the melt separated completely into an upper layer of molten B$_2$O$_3$ and a lower layer of molten GaAs, the pressure inside the chamber was lowered to 5 atmospheres and the chamber interior was left standing under this lower pressure for 30 minutes to subject the lower molten layer to purification by low-pressure distillation. Then, a magnetic field of 1250 oersteds was applied. The temperature fluctuation within the molten GaAs layer which was first about 15° C. fell below 0.1° C. after the application of the magnetic field. Then, with the chamber kept under application of the magnetic field, a seed crystal was brought into contact with the molten GaAs layer and it was pulled at a rate of 9 mm per hour and rotated at a rate of 6 turns a minute for a total period of about 10 hours. Consequently, there was obtained a GaAs single crystal about 50 mm in diameter and about 90 mm in length.

This crystal was cut in a direction parallel to the direction of growth and the section of the crystal was visually examined for possible growth of striation. The examination reveal no presence of any irregular growth of striation due to thermal convection of the molten GaAs layer, indicating that the crystal attained growth in an extremely stable state.

EXAMPLE 2

The procedure of Example 1 was repeated until the formation of the molten GaAs layer. Then, the purification by low-pressure distillation was omitted and the application of the magnetic field of 1250 oersteds was started to effect direct crystal growth. The crystal growth was carried out under the same conditions as used in Example 1. After the crystal grew to a length of about 20 mm, the application of the magnetic field alone was discontinued. After the crystal gained further growth of 15 mm, the application of the magnetic field of 1250 oersteds was resumed. Consequently, there was obtained a GaAs single crystal about 60 mm in length.

Figure 4:
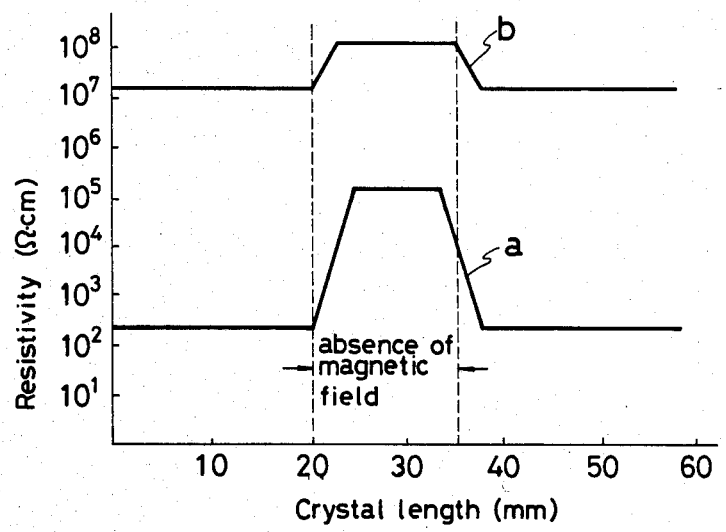
FIG. 4 is a graph showing the resistivity distribution in the GaAs single crystal produced by the method of the present invention.

When this crystal was tested for electric resistance in the direction of growth, there were obtained the results as indicated in the graph of FIG. 4 (curve "a"). It was found that the portion of the crystal growth under the application of the magnetic field showed a low magnitude of electric resistance and the portion grown in the absence of the application of the magnetic field showed a notably high value of electric resistance.

In an effort to elucidate the cause for this sharp contrast, the crystal was tested by photoluminescence. It was consequently revealed that the portion of the crystal growth in the magnetic field showed a notable decline in the concentration of deep defect EL$_2$ level. The Si concentration, when measured by the method of secondary ion mass analysis, was $8 \times 10^{14}$ atom/cm$^3$ in the portion of the crystal grown under the application of the magnetic field. This value was slightly higher than the value ($3 \times 10^{14}$ atom/cm$^3$) shown by the crystal grown under the normal pulling method. From the results described above, it is noted that there were a slight variation in the effective segregation coefficient of impurities and a decline in the native defect density of GaAs.

Further, molten GaAs layer was subjected to purification by low-pressure distillation and then subjected to crystal growth by following the above mentioned procedure. When the produced crystal was similarly tested, it was found to be a GaAs single crystal having a value of improved resistivity indicated by the curve "b" in the graph of FIG. 4.

From the results indicated above, it is noted that the effect of the present invention on the crystal growth was noticeably higher than the molten GaAs layer was purified by expulsion of impurities and subsequently subjected to crystal growth under application of magnetic field than when the molten GaAs layer was directly subjected to crystal growth.

EXAMPLE 3

The procedure of Example 1 was repeated, except that the pulling of seed crystal was carried out at the rate of 27 mm/hour for 3 hours. Consequently, there was obtained a GaAs single crystal about 50 mm in diameter and about 90 mm in length.

This single crystal was longitudinally cross-sectioned. When the section was ground and observed under a microscope, defects such as segregation and void were not detected at all. This crystal showed resistivity of $1 \times 10^8$ Ω.cm, a value higher than the value shown by the crystal grown at a pulling speed of 9 mm/hour. This difference appears to result from the fact that the concentration of impurities was higher in the crystal obtained herein than in the crystal pulled at the rate of 9 mm/hour.

EXAMPLE 4

The procedure of Example 1 was repeated up to the formation of the molten GaAs layer. Then, the purification by low-pressure distillation was omitted and the application of the magnetic field of 1250 oersteds was started to effect direct crystal growth. The seed crystal was pulled first at the rate of 10 mm/hour to a length of 20 mm, then at the rate of 20 mm/hour to an additional length of 15 mm, and finally at the rate of 30 mm/hour to another additional length of 25 mm. Consequently, there was obtained a GaAs single crystal 50 mm in diameter and about 60 mm in overall length.

A wafer was cut from this single crystal. When the wafer was examined, substantially no striation was observed and no segregation was detected. When this crystal was tested for electric resistance in the direction of growth, the resistance was $10^3$ Ω.cm in the portion of the crystal grown at the pulling rate of 10 mm/hour, $\sim 10^7$ Ω.cm in the portion grown at the pulling rate of 20 mm/hour, and $\sim 10^8$ Ω.cm in the portion grown at the pulling rate of 30 mm/hour, indicating that the value increased in proportion as the pulling rate was increased. This is apparently because the deep level of impurities peculiar to the GaAs crystal gradually increased with increasing pulling rate.

EXAMPLE 5

The procedure of Example 1 was repeated, except that a crucible made of quartz was used in place of the crucible made of pyrolytic boron nitride, the magnitude of the magnetic field applied was changed to 1300 oersteds, and the pulling rate of seed crystal was changed to 9 mm/hour, 27 mm/hour, and 36 mm/hour respectively in three test runs. Consequently, there were obtained three GaAs single crystals.

Figure 5:
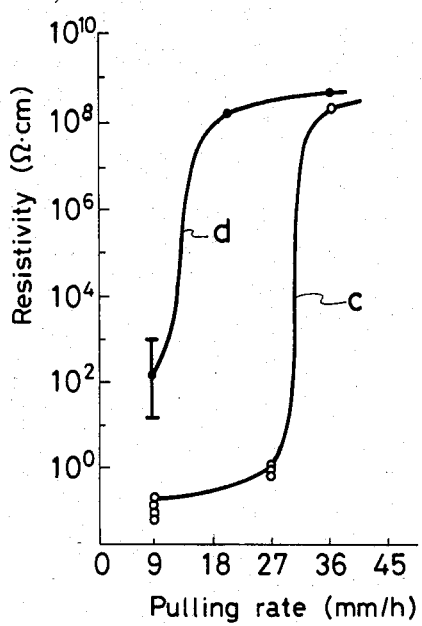
FIG. 5 is a graph showing the relation between the pulling rate of crystal and the resistivity of the produced crystal.

When the crystals were tested for electric resistance, the values of resistance were $\sim 10^{-1}$ Ω.cm, a very low level, for the crystal grown at the pulling rate of 9 mm/hour, $5 \times 10^{-1}$ to $10^0$ Ω.cm for the crystal grown at the pulling rate of 27 mm/hour, and $3 \times 10^8$ Ω.cm, a high level, for the crystal grown at the pulling rate of 36 mm/hour as shown by the curve "c" in the graph of FIG. 5. A wafer cut from the crystal of the highest magnitude of resistance, when tested for resistance distribution, was found to have resistances over the range of $2 \times 10^8$ to $5 \times 10^8$ Ω.cm, indicating that the resistance was substantially uniform.

Thus, the crystals produced herein by using the crucible of quartz acquired high resistances despite the absence of addition of Cr, for example. This is assumed to be because application of magnetic field repressed convection of the molten GaAs layer and curbed migration of silicon from the crucible wall and because the increase in the pulling rate of seed crystal resulted in an increase in the concentration of the deep impurities level peculiar to GaAs.

The aforementioned procedure was further repeated, except that a crucible made of pyrolytic boron nitride was used in place of the crucible made of quartz and the pulling rate of the seed crystal was changed to 9 mm/hour, 18 mm/hour, and 27 mm/hour respectively in three test runs. Consequently, there was obtained three crystals.

The magnitude of electric resistance varied widely from $10^1$ to $10^3$ Ω.cm for the crystal grown at the pulling rate of 9 mm/hour, was $10^8$ Ω.cm, a high level, for the crystal grown at the pulling rate of 18 mm/hour, and was $5 \times 10^8$ Ω.cm, a still higher level, for the crystal grown at the pulling rate of 27 mm/hour, as shown by the curve "d" in the graph of FIG. 5.

EXAMPLE 6

In the same apparatus as used in Example 1, the crucible was charged with 500 g of Ga, 600 g of As, 280 mg of Cr, and 180 g of $B_2O_3$ and the thermal treatment was carried out to obtain a melt of the raw materials for the crystal. Then, the pressure inside the high-pressure chamber was adjusted to 5 atmospheres and the melt in the crucible was left standing for 30 minutes for low-pressure distillation. Thereafter, the pressure inside the chamber was raised to 20 atmospheres. The purification by low-pressure distillation was repeated two more times. Thereafter, the pressure was increased to 20 atmospheres and the application of a magnetic field of 1250 oersteds to the molten GaAs layer was started. While the molten GaAs layer was held under these conditions, the seed crystal was brought into contact therewith and then pulled at the rate of 9 mm/hour as rotated at the rate of 6 turns per minute for 10 hours. Consequently, there was obtained a GaAs single crystal about 50 mm in diameter and about 90 mm in length.

This crystal was cut in a direction parallel to the direction of growth and the section of the crystal was visually examined for possible growth of striation. The examination revealed no presence of any irregular growth of striation due to thermal convection of the molten GaAs layer, indicating that the crystal attained growth in an extremely stable state. The solidification ratio of the crystal relative to the molten GaAs layer was about 0.75, the concentration of Cr was not more than $3 \times 10^{15}$ atom/cm$^3$ throughout from the head to the tail of the crystal, and the resistance was not less than $10^8$ Ω.cm. When a wafer cut from this crystal was subjected to a thermal treatment at 850° C., virtually no change was observed to occur in the resistance. The native crystal defect $EL_2$ level of GaAs in the crystal was not more than $3 \times 10^{15}$ cm$^{-3}$.

Pulling of the crystal was carried out under the same conditions as described above except that the amount of Cr added was decreased to 10 mg. A GaAs single crystal thus obtained was found to have resistivity of $1 \times 10^{-8}$ Ω.cm. A wafer cut from this single crystal was found to have substantially uniform resistances throughout the wafer.

EXAMPLE 7

Figure 6A:
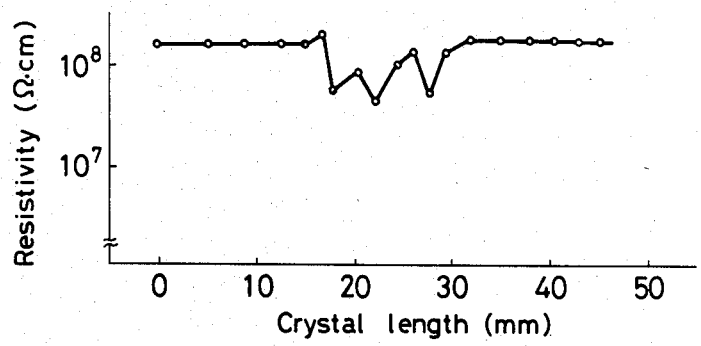
FIG. 6A is a graph showing the resistivity distribution in the GaAs single crystal produced by the method of this invention.
Figure 6B:
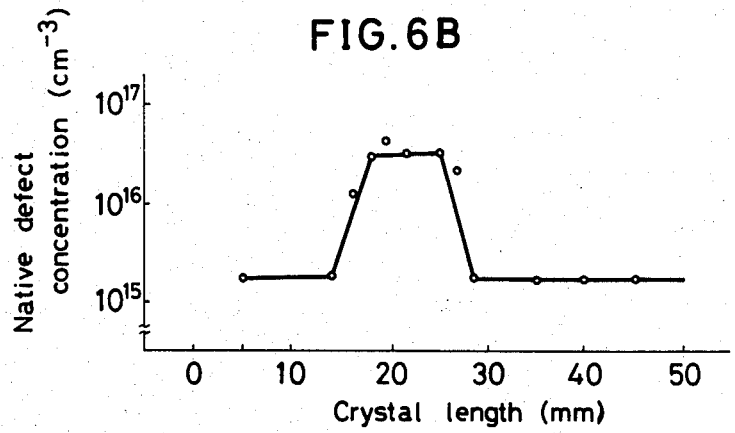
FIG. 6B is a graph showing the distribution of native defect concentration in the GaAs single crystal produced by the method of this invention.

The procedure of Example 6 was repeated by using Ga and As both of purity 7N. When there was formed a molten GaAs layer (incorporating 280 mg of Cr), the purification of low-pressure distillation was omitted and the application of a magnetic field of 1250 oersteds was started to effect crystal growth directly. The crystal growth was carried out under the same conditions as used in Example 6. When the crystal grew to about 15 mm, the application of the magnetic field alone was discontinued. When the crystal grew to an additional length of about 12 mm, the application of the magnetic field of 1250 oersteds was resumed. Consequently, there was obtained a GaAs single crystal about 50 mm in length. This crystal was tested for resistivity in the direction of growth and for native defect concentration. The results were as shown in FIGS. 6A and 6B. As is noted from FIG. 6A, the magnitude of resistance was more than $3 \times 18^8$ $\Omega$.cm in the portion of the crystal grown in the presence of the applied magnetic field and was $5 \times 10^7$ to $8 \times 10^7$ $\Omega$.cm, a lower and more dispersed level, in the portion of the crystal grown in the absence of the magnetic field. The native defect concentration, as is noted from FIG. 6B, was not more than $3 \times 10^{15}$ cm$^{-3}$ in the position of the crystal grown in the presence of the magnetic field and $5 \times 10^{16}$ to $8 \times 10^{16}$ cm$^{-3}$, a noticeably higher level, in the portion of the crystal grown in the absence of the magnetic field. Further, in the portion of the crystal grown in the presence of the magnetic field, no thermal conversion was observed.

What is claimed is:

1. A method for the production of a GaAs single crystal by the liquid-encapsulated Czochralski method, which comprises the steps of:

applying a magnetic field to a melt of encapsulated GaAs;

bringing a seed crystal into contact with said encapsulated melt of GaAs as said magnetic field is being applied, said magnetic field having a sufficient intensity which enables the temperature fluctuations in the neighborhood of the solid-liquid boundary in said encapsulated melt to be repressed to within 1° C.; and pulling said seed crystal at a rate of up to about 40 mm/hour, thereby achieving crystal growth.

2. The method according to claim 1, wherein the pulling step of said seed crystal is accomplished at a rate in the range of 15 to 30 mm/hour.

3. The method according to claim 1, wherein said magnetic field applied exceeds 1000 oersteds.

4. The method according to claim 1 wherein said temperature fluctuations are repressed to less than 0.1° C.

5. The method according to claim 1, wherein said melt of encapsulated GaAs is a melt purified by low-pressure distillation which purification is performed prior to contacting said melt with said seed crystal.

6. The method according to claim 1, wherein said melt of encapsulated GaAs contains Cr in an amount of less than $3 \times 10^{15}$ atom/cm$^3$.

7. A method for the production of a GaAs single crystal by the liquid-encapsulated Czochralski method, which comprises the steps of:

applying a magnetic field to a melt of encapsulated GaAs which contains chromium in an amount of less than $3 \times 10^{15}$ atom./cm$^3$;

bringing a seed crystal into contact with said encapsulated melt of GaAs as said magnetic field is being applied, said magnetic field having a sufficient intensity which enables the temperature fluctuations in the neighborhood of the solid-liquid boundary in said encapsulated melt to be repressed to within 1° C.; and pulling said seed crystal at a rate of up to about 40 mm/hour, thereby achieving crystal growth.

* * * * *